United States Patent
Jeon

(10) Patent No.: US 9,473,171 B2
(45) Date of Patent: Oct. 18, 2016

(54) DATA ENCODING METHOD FOR COMPRESSING DATA TO BE STORED, DATA STORAGE DEVICE WITH DATA ENCODER, AND OPERATING METHOD OF DATA STORAGE DEVICE

(71) Applicant: SK hynix Inc., Gyeonggi-do (KR)

(72) Inventor: Myeong Woon Jeon, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/571,921

(22) Filed: Dec. 16, 2014

(65) Prior Publication Data

US 2016/0065240 A1 Mar. 3, 2016

(30) Foreign Application Priority Data

Aug. 26, 2014 (KR) ........................ 10-2014-0111448

(51) Int. Cl.
| | | |
|---|---|---|
| *G11C 16/10* | (2006.01) | |
| *H03M 7/30* | (2006.01) | |
| *G11C 7/10* | (2006.01) | |
| *G11C 11/56* | (2006.01) | |
| *G11C 16/34* | (2006.01) | |

(52) U.S. Cl.
CPC ............. *H03M 7/60* (2013.01); *G11C 7/1006* (2013.01); *G11C 11/5628* (2013.01); *G11C 16/10* (2013.01); *G11C 16/3427* (2013.01)

(58) Field of Classification Search
CPC ... G11C 16/10; G11C 16/0483; G11C 16/34; G11C 16/3404
USPC ......................................... 365/185.18, 185.24
See application file for complete search history.

(56) References Cited

U.S. PATENT DOCUMENTS

| | | | | |
|---|---|---|---|---|
| 2010/0057977 A1* | 3/2010 | Graef | ................... | G11C 7/1006 711/103 |
| 2010/0125701 A1* | 5/2010 | Park | ...................... | G06F 11/141 711/103 |
| 2011/0026545 A1* | 2/2011 | Kim | ....................... | H03M 7/40 370/476 |
| 2016/0011807 A1* | 1/2016 | Seol | ...................... | G06F 3/0619 711/102 |

FOREIGN PATENT DOCUMENTS

| | | |
|---|---|---|
| KR | 1020100055906 | 5/2010 |
| KR | 1020100085656 | 7/2010 |

* cited by examiner

*Primary Examiner* — Thao H Bui
*Assistant Examiner* — Alfredo Bermudez Lozada
(74) *Attorney, Agent, or Firm* — IP & T Group LLP

(57) ABSTRACT

Provided is a data encoding method such that memory cells storing the data form a biased threshold voltage distribution. The data encoding method may include receiving N bits of first data, and converting the first data into M bits of second data, wherein the proportion of a first value in the second data is higher than the proportion of a second value.

11 Claims, 7 Drawing Sheets

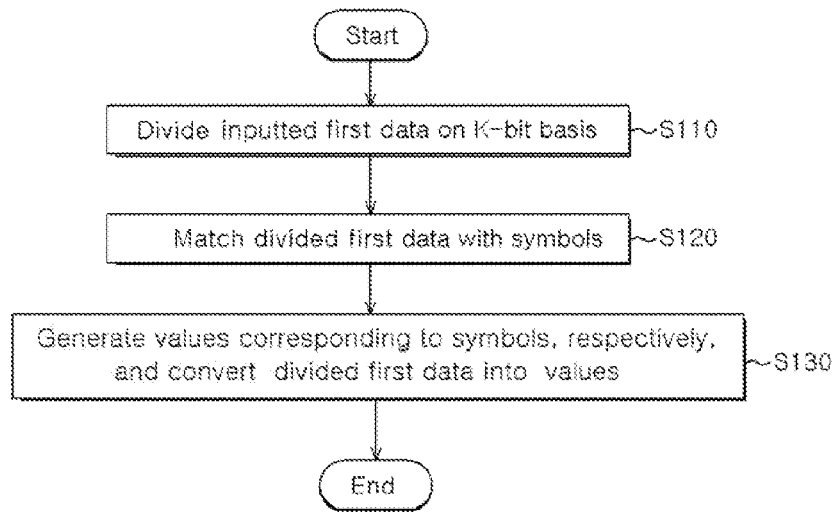

| Initial Value | 00 | 01 | 10 | 11 |
|---|---|---|---|---|
| Symbol | A | B | C | D |
| Converted Value | 0 | 101 | 11 | 100 |

TB2

|  | Entire Bit Number | Number of 1 | Proportion of 1 |
|---|---|---|---|
| First Data | 200 | 70 | 35% |
| Second Data | 185 | 110 | 59.5% |

DATA ENCODING METHOD FOR COMPRESSING DATA TO BE STORED, DATA STORAGE DEVICE WITH DATA ENCODER, AND OPERATING METHOD OF DATA STORAGE DEVICE

CROSS-REFERENCES TO RELATED APPLICATION

The present application claims priority under 35 U.S.C. §119(a) to Korean application number 10-2014-0111448, filed on Aug. 26, 2014, in the Korean Intellectual Property Office, which is incorporated herein by reference in its entirety.

BACKGROUND

1. Technical Field

Various embodiments relate to a data storage device, and more particularly, to a data storage device which encodes input data and stores the encoded data.

2. Related Art

Semiconductor memory devices store data and are generally categorized into nonvolatile and volatile memory devices.

Nonvolatile memory devices retain data stored even without a constant source of power. Nonvolatile memory device include flash memory devices such as NAND Flash or NOR Flash, FeRAM (Ferroelectric Random Access Memory), PCRAM (Phase-Change Random Access Memory), MRAM (Magnetoresistive Random Access Memory), or ReRAM (Resistive Random Access Memory).

Volatile memory devices are unable to retain data without a constant power supply. Volatile memory device include SRAM (Static Random Access Memory), DRAM (Dynamic Random Access Memory) or the like. Volatile memory devices may be used as a buffer memory device, a cache memory device, or a working memory device in a data processing system, because of their relatively high data processing speed.

SUMMARY

In an embodiment of the present disclosure, a data encoding method may include receiving N bits of first data and converting the first data into M bits of second data, wherein the proportion of a first value in the second data is higher than the proportion of a second value.

In an embodiment of the present disclosure, an operating method of a data storage device may include converting N bits of first data into M bits of second data, and writing the second data to memory cells, wherein the memory cells storing the second data form a biased threshold voltage distribution.

In an embodiment of the present disclosure, a data storage device may include an encoder suitable for compressing N bits of first data and generating M bits of second data, and a nonvolatile memory device including a plurality of memory cells, and suitable for storing the second data in the memory cells, wherein the second data are generated to be biased to a first value of binary numbers.

BRIEF DESCRIPTION OF THE DRAWINGS

Features, aspects, and embodiments are described in conjunction with the attached drawings, in which:

FIG. 4 is a flowchart for explaining a method in which an encoder illustrated in FIG. 1 converts inputted first data and generates second data;

FIG. 5 is a diagram illustrating a process in which first data are converted into second data according to the procedure illustrated in FIG. 4;

DETAILED DESCRIPTION

Figure 1:
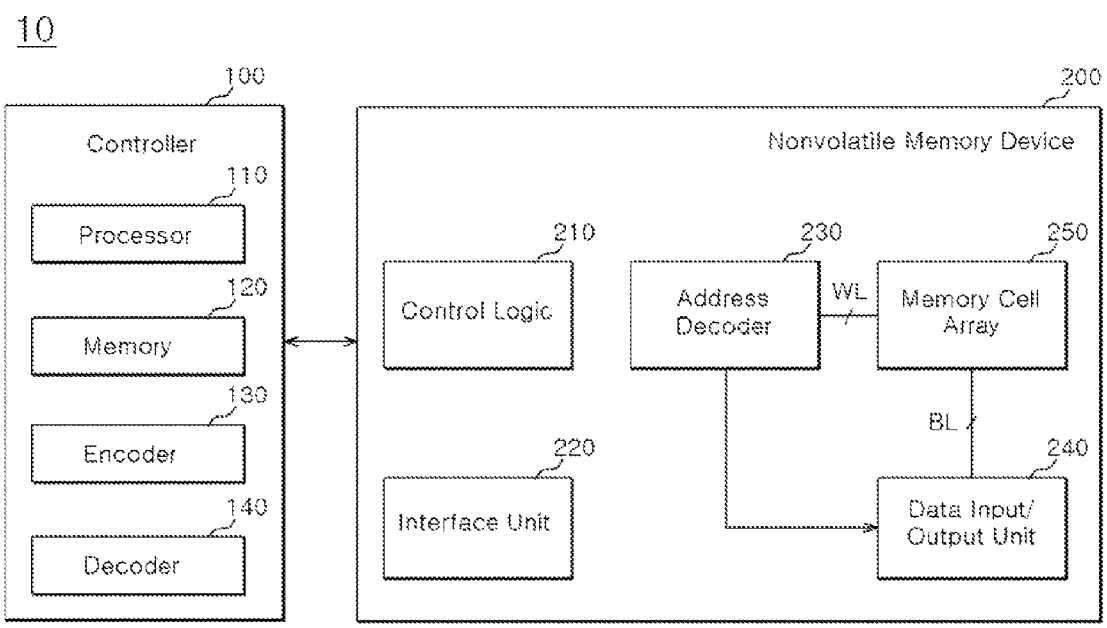
FIG. 1 is a block diagram illustrating a data storage device according to an embodiment of the present disclosure.

A data storage device and an operating method thereof according to the present disclosure will be described below with reference to the accompanying drawings through exemplary embodiments. The present invention may, however, be embodied in different forms and should not be construed as being limited to the embodiments set forth herein. Rather, these embodiments are provided to describe the present invention in detail to the extent that a person skilled in the art to which the invention pertains can easily enforce the technical concept of the present invention.

It is to be understood that embodiments of the present invention are not limited to the particulars shown in the drawings and that the drawings are not necessarily to scale and in some instances proportions may have been exaggerated in order to more clearly depict certain features of the invention. While particular terminology is used herein, it is to be appreciated that the terminology used herein is for the purpose of describing particular embodiments only and is not intended to limit the scope of the present invention.

FIG. 1 is a block diagram illustrating a data storage device 10 according to an embodiment of the present disclosure.

The data storage device 10 may be configured to store data provided from an external device (not illustrated), in response to a write request of the external device. Furthermore, the data storage device 10 may be configured to provide the stored data to the external device in response to a read request of the external device. The data storage device 10 may include a PCMCIA (Personal Computer Memory Card International Association) card, a CF (Compact Flash) card, a smart media card, a memory stick, a multi media card (MMC, eMMC, RS-MMC, and MMC-micro), a SD (Secure Digital) card (SD, Mini-SD, and Micro-SD), UFS (Universal Flash Storage), or a solid state drive (SSD).

The data storage device 10 may include a controller 100 and a nonvolatile memory device 200.

The controller 100 may include a processor 110, a memory 120, an encoder 130, and a decoder 140.

The processor 110 may control overall operations of the data storage device 10. The processor 110 may control a write operation or a read operation of the nonvolatile memory device 200 in response to a write request or a read request of the external device, respectively. The processor 110 may run a software program on the memory 120, in order to control the operation of the data storage device 10.

The memory 120 may perform the function of a working memory, a buffer memory, or a cache memory for the processor 110. The memory 120 may store various program data and a software program run by the processor 110, buffer data transmitted between the external device and the nonvolatile memory device 200, or temporarily store cache data.

The encoder 130 may receive data to be written to the nonvolatile memory device 200, and convert the received data. In this case, the encoder 130 may compress the received data such that the compressed data are biased to a first value of binary numbers. Specifically, the encoder 130 may compress first N-bit input data into second M-bit data and output the compressed data, where M is smaller than N. The second data may be generated to be biased to the first value of the binary numbers. In other words, the proportion of the first values in the second data may be higher than the proportion of the second values in the second data.

The decoder 140 may receive data read from the nonvolatile memory device 200, and decode the received data. The decoder 140 may recover data which are compressed by the encoder 130 and stored in the nonvolatile memory device 200.

The nonvolatile memory device 200 may include a control logic 210, an interface unit 220, an address decoder 230, a data input/output unit 240, and a memory cell array 250.

The control logic 210 may control overall operations such as a write operation, a read operation, and an erase operation of the nonvolatile memory device 200 in response to a command provided from the controller 100.

The Interface unit 220 may exchange various control signals and data with the controller 100, the various control signals including commands and addresses. The interface unit 220 may transmit the various control signals and the data to internal units of the nonvolatile memory device 200.

The address decoder 230 may decode a row address and a column address, which are received from the interface unit 220. The address decoder 230 may control word lines WL to be selectively driven based on the decoding result of the row address. The address decoder 230 may control the data input/output unit 240 to selectively drive bit lines BL based on the decoding result of the column address.

The data input/output unit 240 may transmit the data received from the interface unit 220 to the memory cell array 250 through the bit lines BL. The data input/output unit 240 may transmit data read through the bit lines BL from the memory cell array 250 to the interface unit 220.

The memory cell array 250 may include a plurality of memory cells (not illustrated) arranged at the respective intersections between the word lines WL and the bit lines BL. The memory cells may be divided depending on how many bits of data are stored in each. For example, the memory cells may be divided into single level cells to store one bit per cell and multi-level cells to store two or more bits per cell.

The memory cell array 250 may perform an erase operation on a memory block basis, and perform a write or read operation on a page basis. The memory cell array 250 may be accessed to write or read data on the basis of a physical address allocated on a memory block or page basis.

Figure 2:
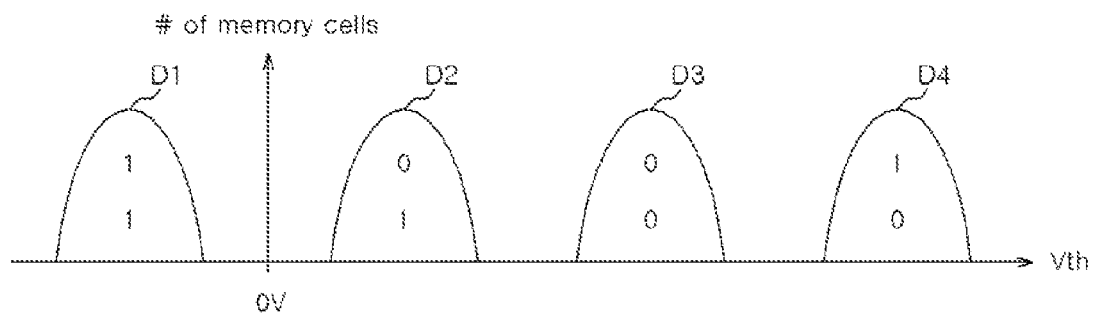
FIG. 2 is a diagram illustrating threshold voltage distributions of memory cells.

FIG. 2 is a diagram illustrating threshold voltage distributions of memory cells. For example, the memory cells included in the memory cell array 250 of FIG. 1 are described as multi-level cells, each capable of storing two bits.

An operation of writing data to a memory cell may be performed by applying a voltage to a word line coupled to the memory cell in order to increase a threshold voltage of the memory cell by injecting electric charges into the floating gate of the memory cell. A memory cell may have a threshold voltage within a predetermined range based on data stored therein. For example, a memory cell storing data '11' may have a threshold voltage forming a first distribution D1, and a memory cell storing data '01' may have a threshold voltage forming a second distribution D2. A memory cell storing data '00' may have a threshold voltage forming a third distribution D3, and a memory cell storing data '10' may have a threshold voltage forming a fourth distribution D4.

Figure 3A:
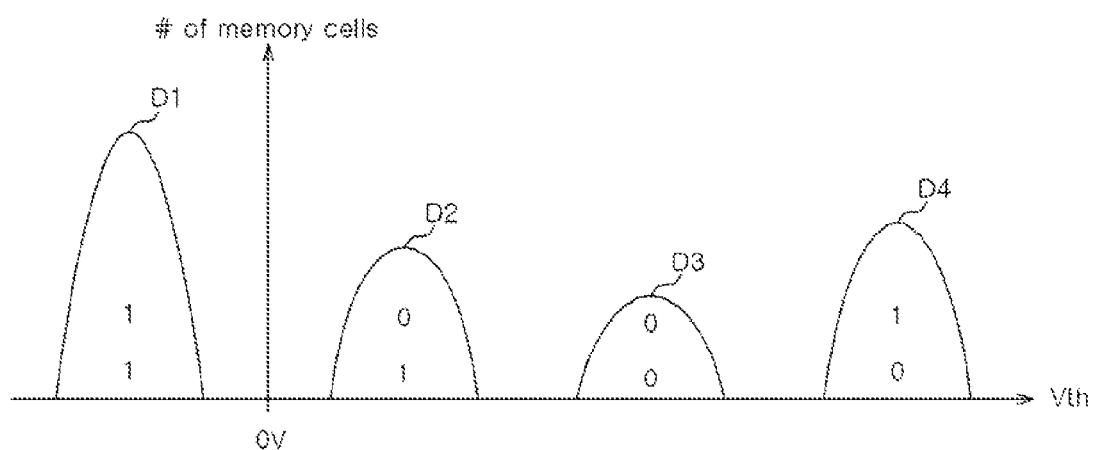
FIGS. 3A and 3B are diagrams illustrating biased threshold voltage distributions of memory cells.
Figure 3B:
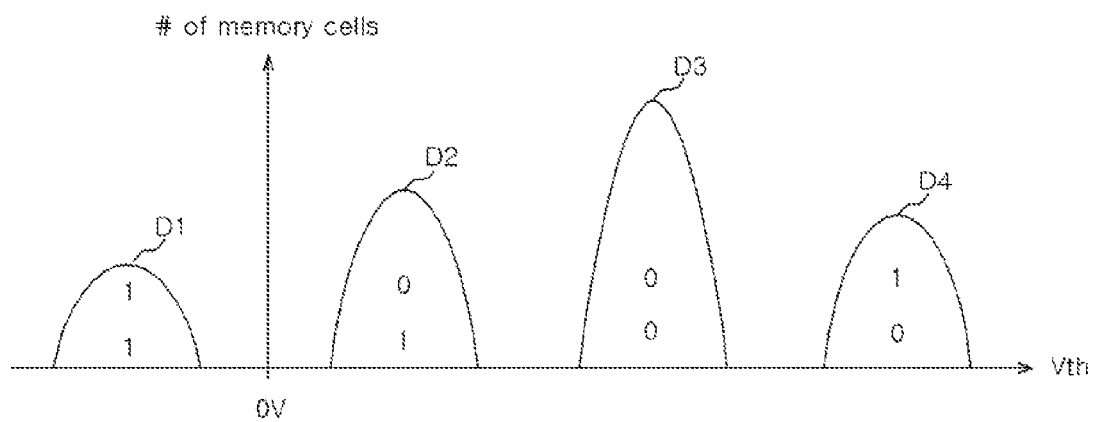

FIGS. 3A and 3B are diagrams illustrating biased threshold voltage distributions of memory cells.

The data storage device 10 may reduce a specific threshold voltage distribution of memory cells, that is, the number of memory cells corresponding to the specific threshold voltage distribution, in order to guarantee improved data reliability. For example, the data storage device 10 may reduce a specific threshold voltage distribution corresponding to a threshold voltage level which may easily cause an interference effect to adjacent memory cells. For example, the data storage device 10 may reduce a specific threshold voltage distribution having a low retention characteristic. When the data storage device 10 reduces the specific threshold voltage distribution, the threshold voltage distribution of memory cells may be biased.

The data storage device 10 may bias data and store the biased data in memory cells, in order to bias the threshold voltage distribution of the memory cells. The encoder 130 may convert data to be stored in the memory cells such that the data are biased to the first value of the binary numbers. The encoder 130 may convert data such that the proportion of the first values, that is, 'biased values' in the data is higher than the proportion of the second values, that is, 'unbiased values'.

FIG. 3A illustrates a threshold voltage distribution of memory cells when data stored in the memory cells are biased to '1'.

The data biased to '1' may have a relatively high probability of being data '11'. Furthermore, as the number of memory cells storing the data '11' increases, the first distribution D1 may be formed to be relatively high. On the other hand, the data biased to '1' may have a relatively low probability of being data '00'. Furthermore, as the number of memory cells storing the data '00' decreases, the third distribution D3 may be formed to be relatively low.

FIG. 3B illustrates a threshold voltage distribution of memory cells when data stored in the memory cells are biased to '0'.

The data biased to '0' may have a relatively high probability of being data '00'. Furthermore, as the number of memory cells storing the data '00' increases, the third distribution D3 may be formed to be relatively high. On the other hand, the data biased to '0' may have a relatively low probability of being data '11'. Furthermore, as the number of memory cells storing the data '00' decreases, the first distribution D1 may be formed to be relatively low.

Hereafter, it is described as an example that the data storage device 10 converts input data such that the converted data are biased to '1'.

FIGS. 4 and 5 are a flowchart and a diagram for explaining a method in which the encoder 130 illustrated in FIG. 1 converts inputted first data and generates second data.

Hereafter, referring to FIGS. 4 and 5, an operating method of the encoder 130 will be described.

At step S110, the encoder 130 may divide inputted first data on a K-bit basis. Referring to FIG. 5, the encoder 130 may divide the first data by two bits, for example.

At step S120, the encoder 130 may match the divided first data with different symbols, respectively, based on the values of the divided first data. FIG. 5 illustrates a table TB1 showing symbols corresponding to initial values. Each of the initial values may correspond to data divided on a K-bit basis. When the initial values correspond to data divided by two bits, the number of cases for the initial values is four. Thus, the divided first data may be matched with four symbols. When the first data are divided on a K-bit basis, the divided first data may be matched with $2^K$ symbols.

At step S130, the encoder may generate values corresponding to the symbols, respectively, and convert the divided first data into the values based on the symbols matched with the divided first data. The table TB1 of FIG. 5 shows the converted values corresponding to the respective symbols. Based on the table TB1, the converted values corresponding to the respective symbols may form second data.

Figure 6:
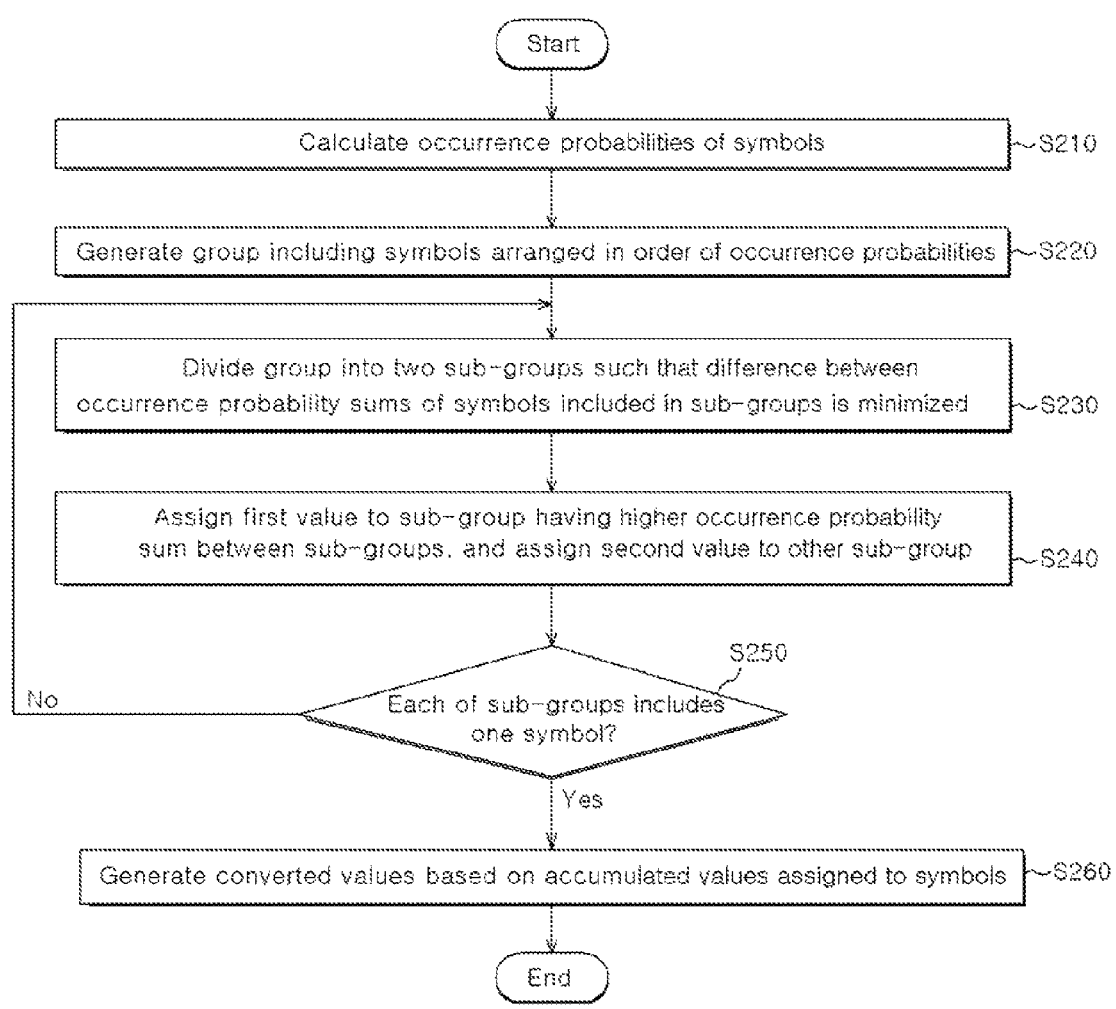
FIG. 6 is a flowchart explaining a method in which the encoder illustrated in FIG. 1 generates converted values corresponding to symbols.

FIG. 6 is a flowchart for explaining a method in which the encoder 130 illustrated in FIG. 1 generates the converted values corresponding to the symbols.

At step S210, the encoder 130 may calculate the occurrence probability of each symbol, based on how many times the symbol is matched with the inputted first data.

At step S220, the encoder 130 may generate a group including the symbols which are arranged in order of occurrence probability.

At step S230, the encoder 130 may divide the group into two sub-groups. At this time, the encoder 130 may divide the group such that a gap in the sum of occurrence probabilities of included symbols is reduced between the sub-groups.

At step S240, the encoder 130 may assign a biased value of the binary numbers to a sub-group having the higher occurrence probability sum between the sub-groups, and assign an unbiased value to the other sub-group. As described above, the proportion of the biased value increases in converted data. When the sub-groups have the same occurrence probability sum, the encoder 130 may assign the biased value to any one and assign the unbiased value to the other one.

At step S250, the encoder 130 may determine whether each of the sub-groups includes one symbol.

When it is determined that each of the sub-groups does not include one symbol (No), the procedure may proceed to step S230. In this case, the encoder 130 may repeat step S230 of dividing each of the sub-groups and step S240 of assigning the first and second values, until each of the divided sub-groups includes one symbol.

When it is determined that each of the sub-groups includes one symbol (Yes), the procedure may proceed to step S260.

At step S260, the encoder 130 may generate the converted values corresponding to the respective symbols, based on accumulated values assigned to each of the symbols. The accumulated values may indicate values which are accumulated and assigned to one or more sub-groups, whenever the symbol is divided to be included in the sub-groups.

Figure 7A:
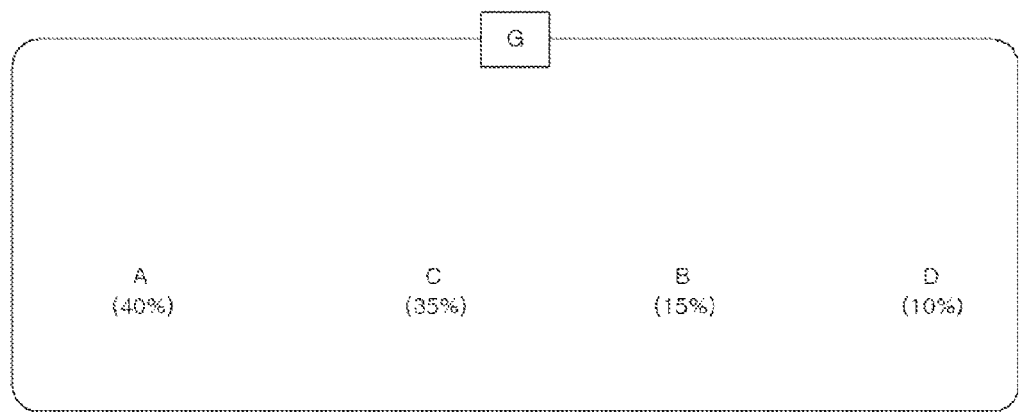
FIGS. 7A and 7D are diagrams illustrating processes of generating the converted values corresponding to the symbols according to the procedure described with reference to FIG. 6.
Figure 7B:
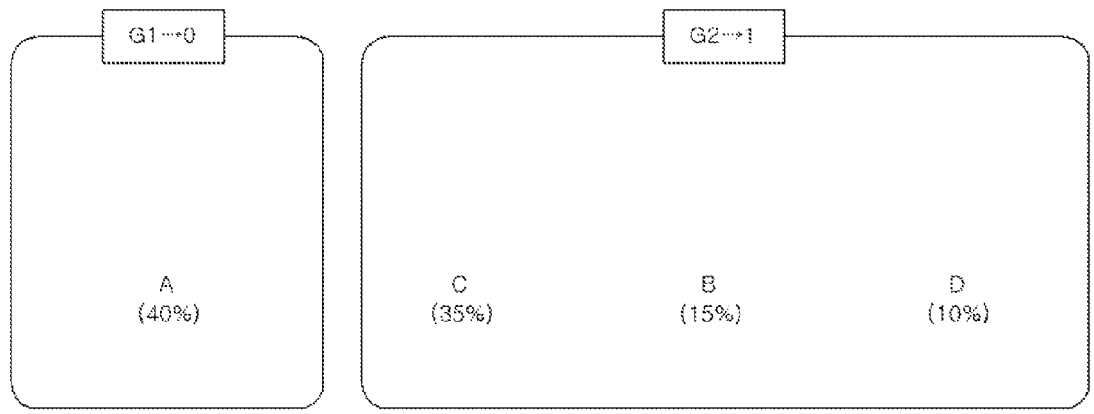
FIG. 7E is a diagram illustrating the generated results.
Figure 7C:
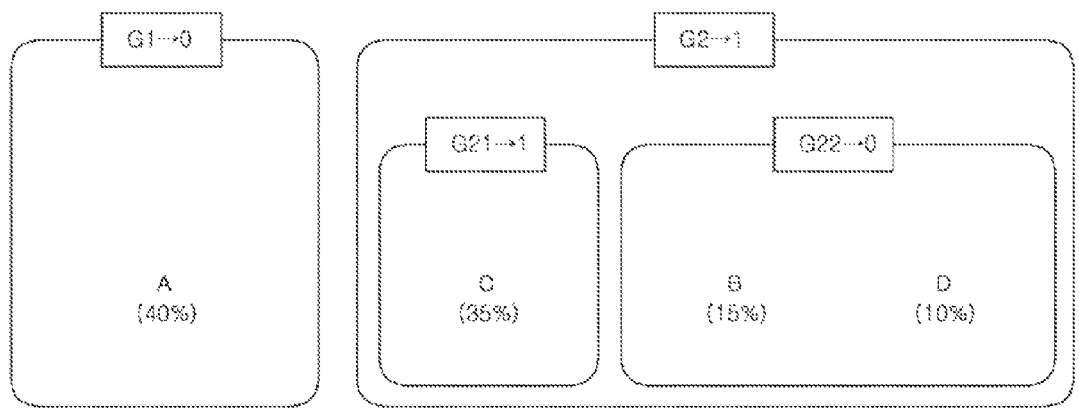
Figure 7D:
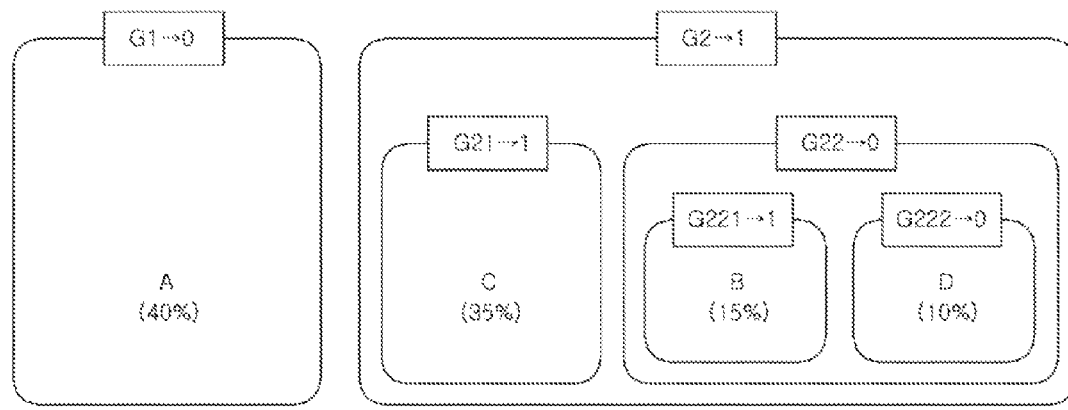
Figures 7E, 8, 9:
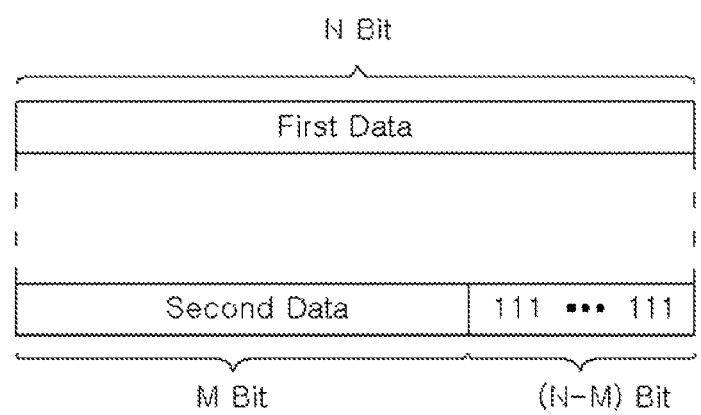
FIG. 8 is a diagram for numerically explaining the effect of converting data according to the processes described with reference to FIGS. 4 to 7E.
FIG. 9 is a diagram for explaining an operating method in which the data storage device illustrated in FIG. 1 additionally stores dummy data.

FIGS. 7A and 7D are diagrams illustrating processes of generating the converted values corresponding to the symbols according to the procedure described with reference to FIG. 6, and FIG. 7E is a diagram illustrating the generated results. Hereafter, it is described as an example that the encoder 130 divides first data by two bits and matches the divided data with symbols A, B, C, and D.

Referring to FIG. 7A, the encoder 130 may calculate the occurrence probabilities of the symbols A, B, C, and D in the inputted first data as 40, 15, 35, and 10%, respectively. The encoder 130 may generate a group G including the symbols A, C, B, and D which are arranged in order of occurrence probabilities. For example, the encoder 130 may arrange the symbols in descending order of occurrence probabilities.

Referring to FIG. 7B, the encoder 130 may divide the group G into two sub-groups G1 and G2 such that a difference between the sum of occurrence probabilities of symbols included in the sub-group G1 and the sum of occurrence probabilities of symbols included in the sub-group G2 is minimized. Specifically, the encoder 130 may divide the group G into sub-groups at the right and left sides of any one point among the arranged symbols A, C, B, and D. When the group G is divided into sub-groups G1 and G2 at the right and left sides of the middle point between the symbols A and C, a difference between the sum of occurrence probabilities of the left sub-group G1 (that is, 40%) and the sum of occurrence probabilities of the right sub-group G2 (that is, 60%) may be the smallest among a plurality of divisions.

The encoder 130 may assign the biased value of '1' to the right sub-group G2 having the higher occurrence probability sum, that is, 60% between the sub-groups G1 and G2, and assign the unbiased value of '0' to the left sub-group G1 having the lower occurrence probability sum, that is, 40%.

The encoder 130 may determine whether each of the sub-groups G1 and G2 may include one symbol. The encoder 130 may repeat dividing each of the sub-groups G1 and G2 and assigning '1' and '0', based on the determination result. At this time, the encoder 130 may repeat the dividing and assigning process until each of the newly divided sub-groups includes only one symbol. The left sub-group G1 includes one symbol A, but the right sub-group G2 includes three symbols C, B, and D. Thus, the encoder 130 may determine that each of the sub-groups G1 and G2 does not include one symbol. As illustrated in FIG. 7C, the encoder 130 may divide the sub-group G2 and assign '1' and '0'.

Referring to FIG. 7C, the encoder 130 may divide the sub-group G2 into new sub-groups at the right and left sides of any one point among the symbols C, B, and D. When the sub-group G2 is divided into new sub-groups G21 and G22 at the right and left sides of the middle point between the symbols C and B, a difference between the sum of occurrence probabilities of the left sub-group G21, that is, 35% and the sum of occurrence probabilities of the right sub-group G22, that is, 25% may be the smallest among a plurality of divisions.

The encoder 130 may assign '1' to the left sub-group G21 having the higher occurrence probability sum of 35% between the new sub-groups G21 and G22, and assign '0' to the right sub-group G22 having the lower occurrence probability sum of 25%.

The encoder 130 may determine whether each of the sub-groups G21 and G22 includes one symbol. The left sub-group G21 includes one symbol C, but the right sub-group G22 includes two symbols B and D. Thus, the encoder 130 may determine that each of the sub-groups G21 and G22 does not include one symbol. As illustrated in FIG. 7D, the encoder 130 may divide the sub-group G22 and assign '1' and '0'.

Referring to FIG. 7D, the encoder 130 may divide the sub-groups G22 into new sub-groups G221 and G222 at the right and left sides of the middle point between the symbols B and D.

The encoder 130 may assign '1' to the left sub-group G221 having the higher occurrence probability sum of 15% between the new sub-groups G221 and G222, and assign '0' to the right sub-group G222 having the lower occurrence probability sum of 10%.

The encoder 130 may determine that each of all the sub-groups includes one symbol.

The encoder 130 may generate converted values corresponding to the respective symbols, based on accumulated values assigned to each of the symbols. In FIGS. 7A to 7D, an accumulated value assigned to the symbol A is '0', and an accumulated value assigned to the symbol B is '101', and an accumulated value assigned to the symbol C is '11', and an accumulated value assigned to the symbol D is '100'.

FIG. 7E illustrates a table TB2 showing the symbols corresponding to the initial values and the converted values generated through the processes illustrated in FIGS. 7A to 7D.

When the second data written to the nonvolatile memory device 200 are read and inputted, the decoder 140 may recover the second data into the first data by referring to the converted values corresponding to the symbols.

FIG. 8 is a diagram for numerically explaining the effect of converting data according to the processes described with reference to FIGS. 4 to 7E.

The encoder 130 may compress the inputted first data and generate the second data. The encoder 130 may generate the second data such that the second data are biased to the biased value, that is, '1'. The proportion of '1' in the second data may be higher than the proportion of '0'.

It is described as an example that the entire bit number of the first data is 200. When 40, 15, 35, and 10 numbers of the symbols A, B, C, and D, respectively, are matched with the first data, the occurrence probabilities of the symbols A, B, C, and D may be set to 40, 15, 35, and 10%, respectively.

The entire bit number of the second data may be calculated on the basis of the converted values as follows.

Bit number of second data=40*1+15*3+35*2+10*3=185.

That is, a compression effect of 15 bits (=200 bits−185 bits) may be obtained.

The proportions of '1' in the first and second data may be calculated as follows.

Proportion of '1' in first data=(number of '1')/entire bit number=(15*1+35*1+10*2)/200=35%.

Proportion of '1' in second data=(number of '1')/entire bit number=(15*2+35*2+10*1)/200=59.5%.

The calculation result may indicate that the second data are further biased to '1' than the first data.

FIG. 9 is a diagram for explaining an operating method in which the data storage device 10 illustrated in FIG. 1 additionally stores dummy data.

The encoder 130 may compress first N-bit data and generate second M-bit data, where M is smaller than N. When the second M-bit data are stored in the nonvolatile memory device 200, the data storage device 10 may secure an available space corresponding to (N−M) bits, compared to when the first N-bit data are stored. The data storage device 10 may additionally store (N−M)-bit dummy data composed of the biased values of '1' in the nonvolatile memory device 200, thereby increasing the biased effect.

According to the embodiment of the present disclosure, it is possible to provide a data storage device which is capable of encoding data such that memory cells storing the data form a biased threshold voltage distribution, and storing the encoded data in the memory cells.

While certain embodiments have been described above, it will be understood to those skilled in the art that the embodiments described are by way of example only. Accordingly, the data storage device described herein should not be limited based on the described embodiments. Rather, the data storage device described herein should only be limited in light of the claims that follow when taken in conjunction with the above description and accompanying drawings.

What is claimed is:

1. A data encoding method comprising:
   receiving N bits of first data; and
   encoding the first data into M bits of second data,
   wherein M is smaller than the N,
   wherein the second data consists of binary numbers having a first value and a second value,
   wherein a proportion of the first value is higher than a proportion of the second value,
   wherein the encoding of the first data comprises:
      dividing the first data on a K-bit basis;
      matching divided first data with $2^K$ symbols based on K bits of initial values;
      generating values corresponding to the symbols, respectively; and
      converting the divided first data into values based on the symbols matched with the divided first data,
   wherein the K is a natural number, and
   wherein the generating of values comprises:
      arranging the symbols in order of occurrence probabilities;
      dividing the symbols into two groups at a border between two neighboring symbols of arranged symbols, wherein a sum of occurrence probabilities of symbols included in one group has a minimum gap with a sum of occurrence probabilities of symbols included in a other group;
      assigning the first value to one group having the occurrence probability sum higher than the other group, and the second value to the other group;
      repeating the dividing of the symbols and the assigning of the first and second values, until each of divided groups includes one symbol; and
      generating the values corresponding to the symbols based on the first and second values repeatedly assigned to the divided groups.

2. The data encoding method according to claim 1, wherein the generating of values further comprises:
   calculating the occurrence probabilities based on how many times the symbols are matched with the divided first data in the matching of the divided first data.

3. The data encoding method according to claim 1, further comprising:
   adding (N−M) bits of third data composed of the first values to the second data.

4. An operating method of a data storage device, comprising:
   encoding N bits of first data into M bits of second data; and
   writing the second data to memory cells, wherein the second data consists of binary numbers having a first value and a second value, wherein a proportion of the first value is higher than a proportion of the second value, wherein the memory cells storing the second data form a biased threshold voltage distribution, wherein the encoding of the N bits of first data comprises:
dividing the first data on a K-bit basis;
matching divided first data with $2^K$ symbols based on K bits of initial values;
generating values corresponding to the symbols, respectively; and
converting the divided first data into values based on the symbols, wherein the K is a natural number, and wherein the generating of values further comprises:
arranging the symbols in order of occurrence probabilities;
dividing the symbols into two groups at a border between two neighboring symbols of arranged symbols, wherein a sum of occurrence probabilities of symbols included in one group has a minimum gap with a sum of occurrence probabilities of symbols included in the other group;
assigning a first value to one group having the occurrence probability sum higher than the other group, and a second value to the other group;
repeating the dividing of the symbols and the assigning of the first and second values, until each of divided groups includes one symbol; and
generating the values corresponding to the symbols based on the first and second values repeatedly assigned to the divided groups.

5. The operating method according to claim 4, wherein the generating of values further comprises:
calculating the occurrence probabilities based on how many times the symbols are matched with the divided first data in the matching of the divided first data.

6. The operating method according to claim 4, further comprising:
writing (N-M) bits of third data composed of the first values to the memory cells,
wherein the M is smaller than the N.

7. A data storage device comprising:
an encoder suitable for compressing N bits of first data and generating M bits of second data; and
a nonvolatile memory device comprising a plurality of memory cells, and suitable for storing the second data in the memory cells, wherein the second data consists of binary numbers having a first value and a second value, wherein a proportion of the first value is higher than a proportion of the second value, wherein the encoder divides the first data on a K-bit basis, matches divided first data with $2^K$ symbols based on K bits of initial values, generates values corresponding to the symbols, respectively, and converts the divided first data into values corresponding to the symbols, wherein the K is a natural number, and wherein the encoder divides the symbols arranged in order of occurrence probabilities into two groups at a border between two neighboring symbols of the symbols, assigns the first value to one group having the occurrence probability sum higher than the other group, and the second value to the other group, and generates the values corresponding to the symbols based on the first and second values assigned to divided groups.

8. The data storage device according to claim 7, wherein the sum of occurrence probabilities of symbols included in one group has a minimum gap with the sum of occurrence probabilities of symbols included in the other group.

9. The data storage device according to claim 7, wherein the encoder repeats the dividing of the symbols and the assigning of the first and second values, until each of the divided groups includes one symbol.

10. The data storage device according to claim 8, wherein the encoder calculates the occurrence probabilities based on how many times the symbols are matched with the divided first data.

11. The data storage device according to claim 7, wherein the nonvolatile memory device additionally stores (N–M) bits of third data composed of the first values in the memory cells.

* * * * *